US006946335B1

(12) United States Patent
Ip et al.

(10) Patent No.: US 6,946,335 B1
(45) Date of Patent: Sep. 20, 2005

(54) METHOD OF MANUFACTURING IMPROVED DOUBLE-DIFFUSED METAL-OXIDE-SEMICONDUCTOR DEVICE WITH SELF-ALIGNED CHANNEL

(75) Inventors: Hiu Fung Ip, San Jose, CA (US); Ellick Ma, San Jose, CA (US); Ping Huang, Shanhai (CN)

(73) Assignee: BCD Semiconductor Manufacturing Limited, Grand Cayman (KY)

( * ) Notice: Subject to any disclaimer, the term of this patent is extended or adjusted under 35 U.S.C. 154(b) by 0 days.

(21) Appl. No.: 10/995,166

(22) Filed: Nov. 24, 2004

(51) Int. Cl.[7] .......................................... H01L 21/8234
(52) U.S. Cl. ....................................... 438/197; 438/299
(58) Field of Search ........................ 438/197, 135–138, 438/140, 151, 159, 184, 268, 270, 283, 299, 438/301, 303, 595, 585

(56) References Cited

U.S. PATENT DOCUMENTS 6,025,232 A * 2/2000 Wu et al. .................. 438/270
6,876,035 B2 * 4/2005 Abadeer et al. ............ 257/343

* cited by examiner

*Primary Examiner*—Jack Chen
(74) *Attorney, Agent, or Firm*—Birch, Stewart, Kolasch & Birch, LLP

(57) ABSTRACT

The present invention relates to an integrated circuit manufacturing method for producing a double-diffused metal-oxide-semiconductor (DMOS), which utilizes a removable spacer method with a self-aligned channel to manufacture an improved DMOS with a reduced parasitic capacitance, and a high-resistance DMOS for a high power application can thus be fabricated also. Via the present invention, a faster switch with more usable operating frequencies can be achieved.

5 Claims, 12 Drawing Sheets

METHOD OF MANUFACTURING IMPROVED DOUBLE-DIFFUSED METAL-OXIDE-SEMICONDUCTOR DEVICE WITH SELF-ALIGNED CHANNEL

FIELD OF THE INVENTION

The present invention relates to a method of manufacturing a double-diffused metal-oxide-semiconductor (DMOS), particularly to a method of manufacturing a DMOS with a wider operating frequency.

BACKGROUND OF THE INVENTION

FIG. 1 shows a schematic diagram of a conventional standard DMOS, made of a polysilicon, comprising a source 1, a gate 2 and a drain 3, and therein a given amount of parasitic capacitance will appear inevitably. When a DMOS performs a signal amplification or switch operation, the parasitic capacitance will induce a considerable delay. Thus, if the parasitic capacitance can be reduced, a faster DMOS with more usable frequencies can be accomplished thereby.

The parasitic capacitance is governed by the following equation:

$$C=AKE_0/t,$$

wherein K is the dielectric constant of the insulating material;

$E_0$ is the permitivity constant;

A is the area of the capacitor; and t is thickness of the dielectric material.

From the aforementioned equation, it is obvious that the parasitic capacitance can be reduced either by decreasing the area of the gate-drain overlapping region or by increasing the thickness of the dielectric material in that region.

Referring to FIG. 2 a schematic diagram of a DMOS fabricated by the LOCOS process, the polysilicon gate 4 runs across it, and therefore the thickness of the dielectric material of the gate 4-drain 6 overlapping region increases significantly, but the real gate channel remains the same, and thus the parasitic capacitance can be effectively reduced in this structure. However, this kind of structure is very sensitive to the misalignment with respect to the oxide island, and just a slight shift of the polysilicon alignment will alter the channel width and further affect the operating voltage and the gain of amplification.

The structure of the DMOS shown in FIG. 3 is based on the structure in FIG. 1, but the polysilicon width of the gate 7 is shrunk to reduce the area of the gate 7-drain 8 overlapping region so as to reduce the parasitic capacitance. However, as the width of the poly silicon becomes smaller, the tolerance of manufacturing process becomes extremely tight correspondingly, and consequently a mask and an exposure tool with a higher resolution are required.

SUMMARY OF THE INVENTION

In the aforementioned description, the primary objective of the present invention is to provide a manufacturing method of producing a DMOS with less parasitic capacitance and wider operating frequencies.

The manufacturing method of the present invention comprises the following steps:

- forming a silicon layer of a first type doping on a substrate as a drain;

- oxidizing the surface of the silicon layer to form a field oxide layer;
- forming a vertical opening on the field oxide layer and forming a screen oxide layer on the bottom of the vertical opening;
- forming a first spacer with a first opening over the vertical opening, wherein the first opening has specified width;
- forming a body of a second type doping and a second body of the second type doping with further higher concentration, below the bottom of the screen oxide layer; then removing the first spacer;
- forming a second spacer, which has a second opening with a width larger than that of the first opening, over the screen oxide layer;
- forming a source of the first type doping in the region neighboring the body, the second body and the second opening; then completely removing the second spacer and the screen oxide layer; then forming a gate oxide contacting the source, wherein the gate oxide is positioned in both lateral sides of the vertical opening's bottom; and lastly
- forming a step-like gate conductive layer over the gate oxide and the field oxide layer; then forming an insulating layer to shield the gate conductive layer and the gate oxide; finally depositing a source conductive layer;
- thus, the DMOS manufacture of the present invention is completed.

DETAILED DESCRIPTION OF THE PREFERRED EMBODIMENTS

In co-operation with the drawings, the detailed contents and the technical description will be stated below.

Figure 1:
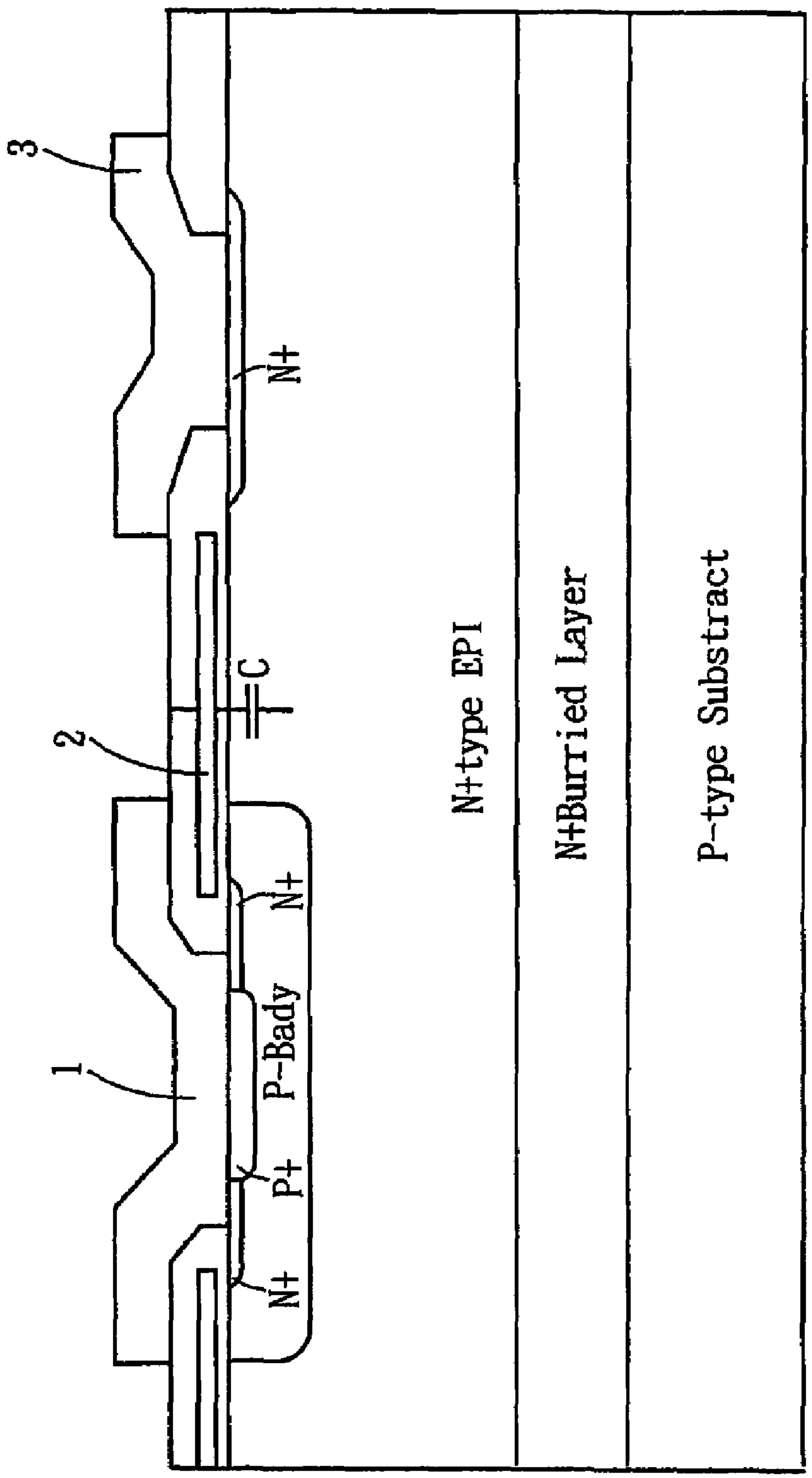
FIG. 1 is a sectional view of the structure of a conventional DMOS.
Figure 2:
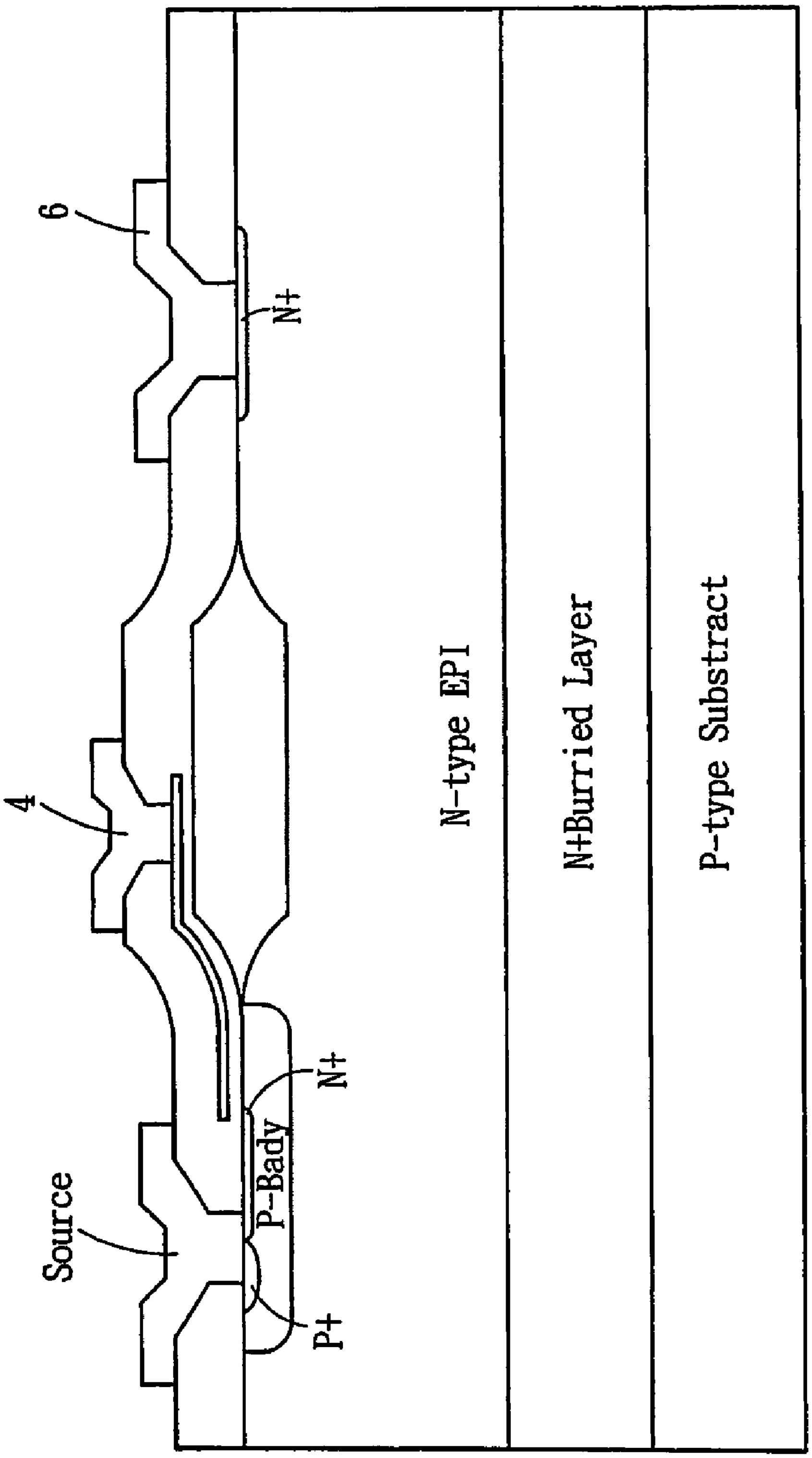
FIG. 2 is a sectional view of the structure of a conventional DMOS fabricated by the LOCOS process.
Figure 3:
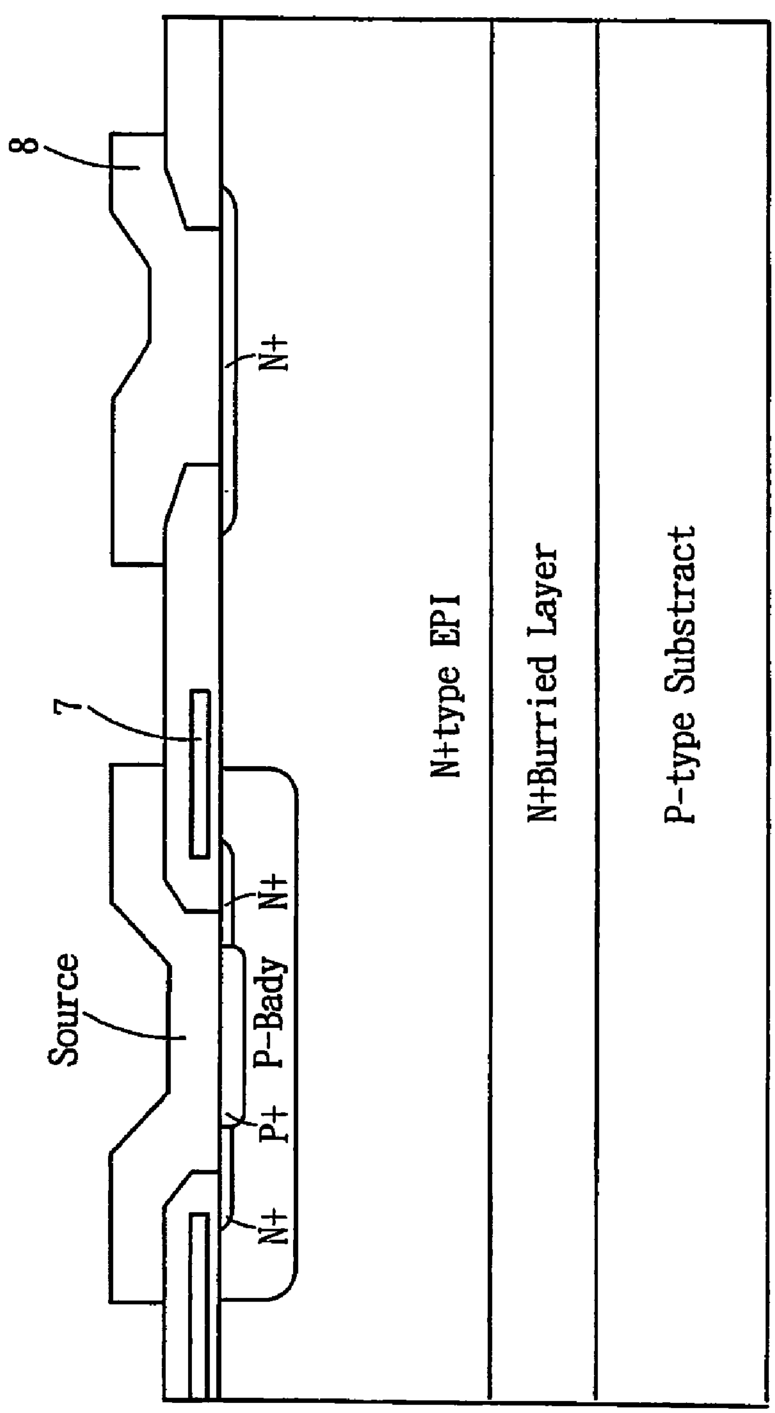
FIG. 3 is a sectional view of the structure of a conventional DMOS whose polysilicon width of the gate shrinks.
Figure 4:
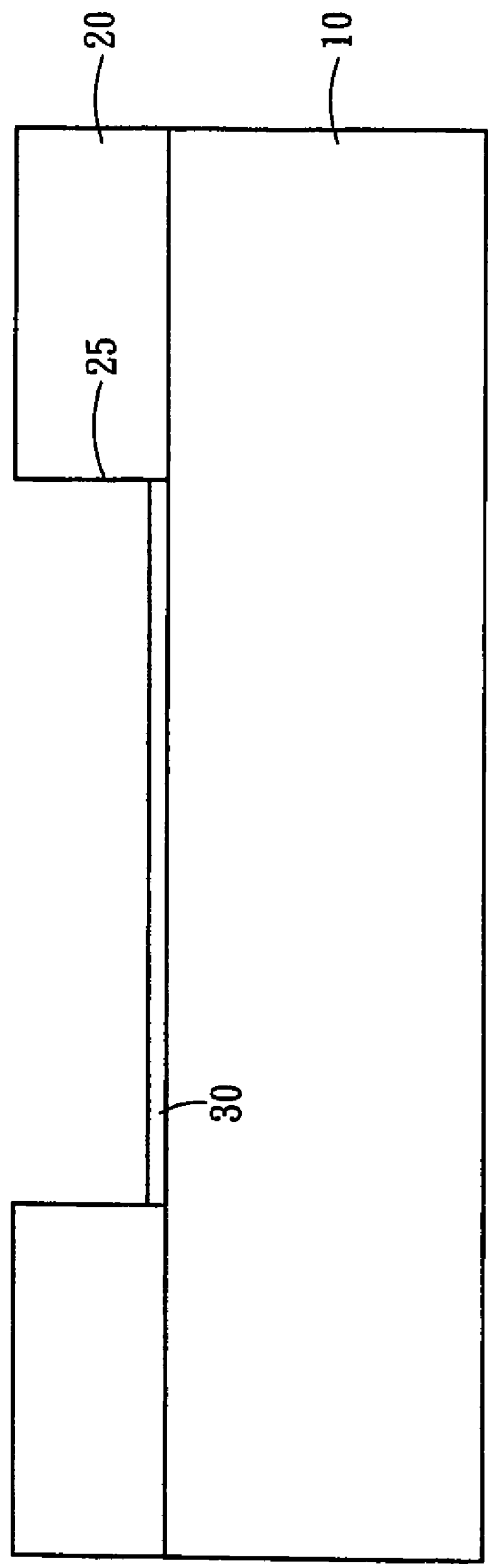
FIG. 4 to FIG. 12 are sectional views separately relating to each step of the manufacturing method of the present invention.
Figure 5:
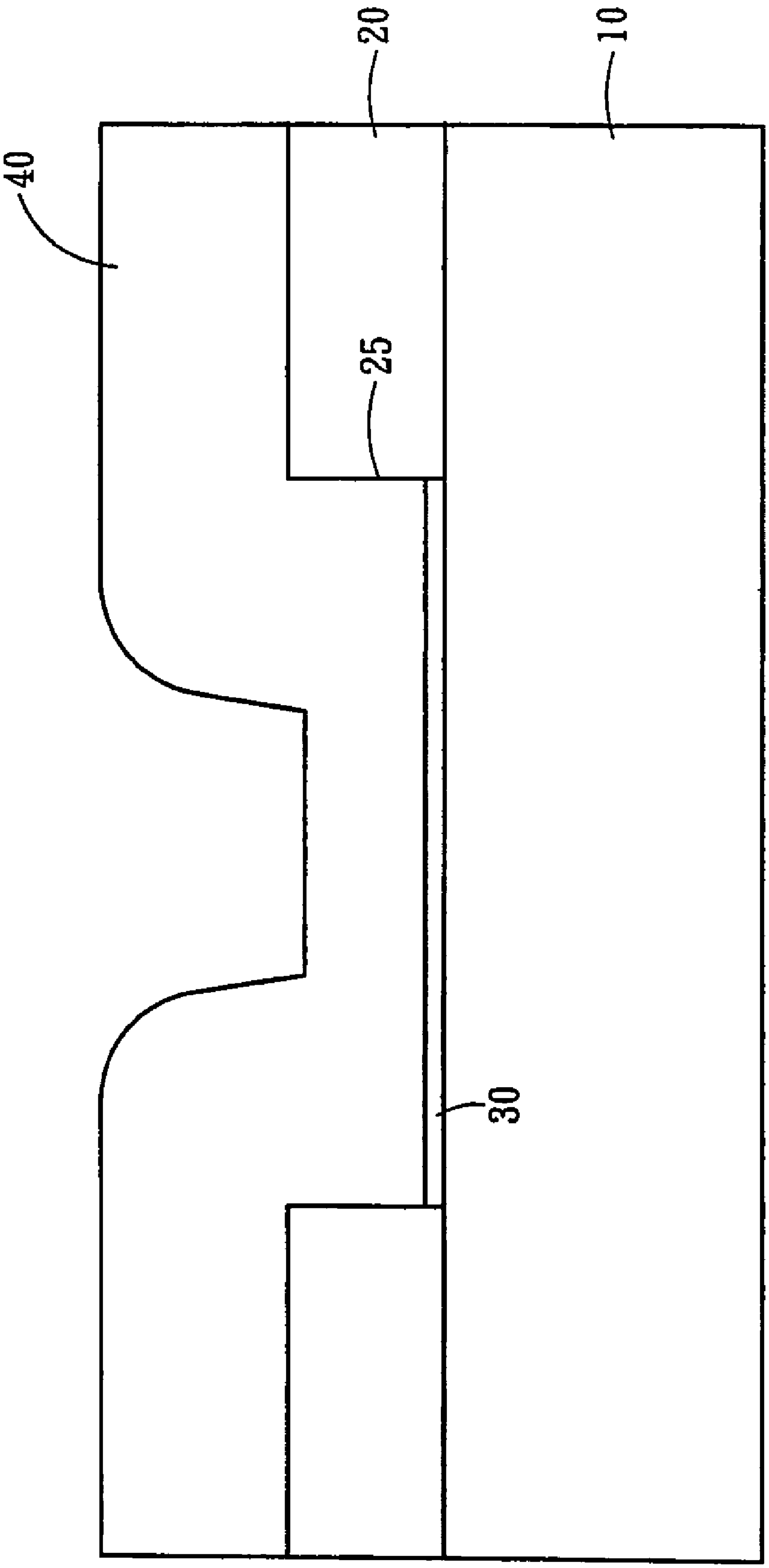
Figure 6:
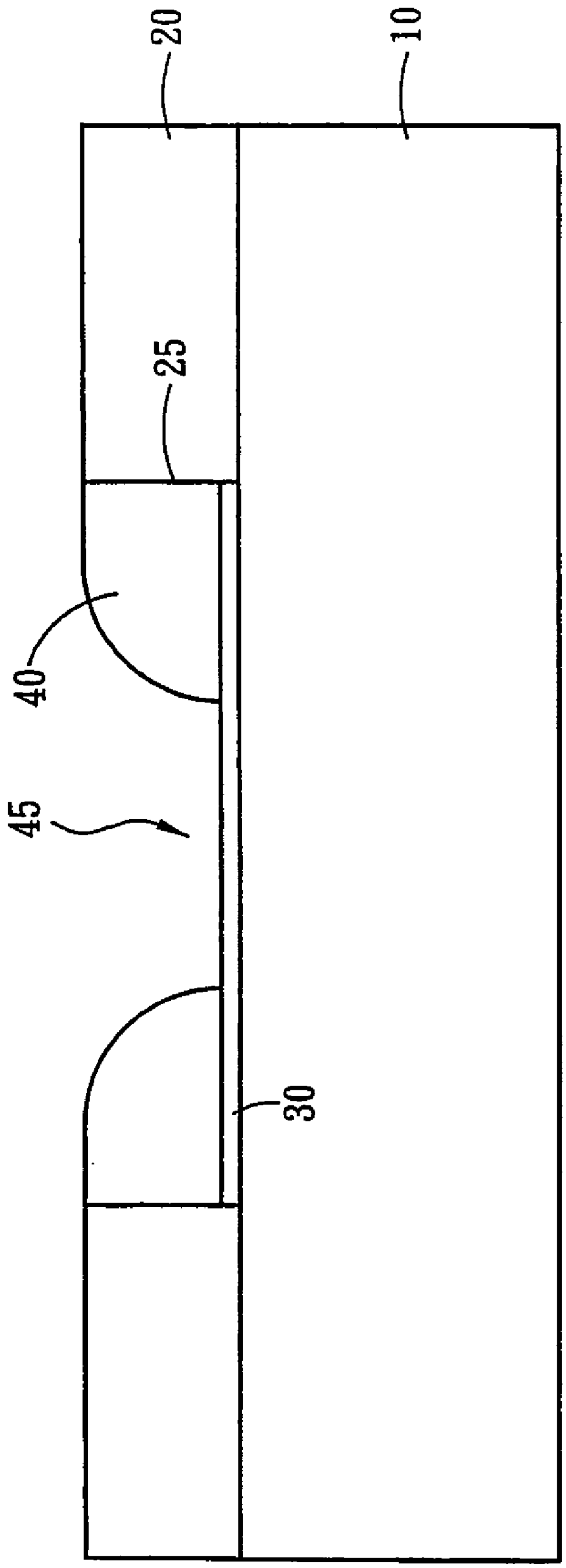
Figure 7:
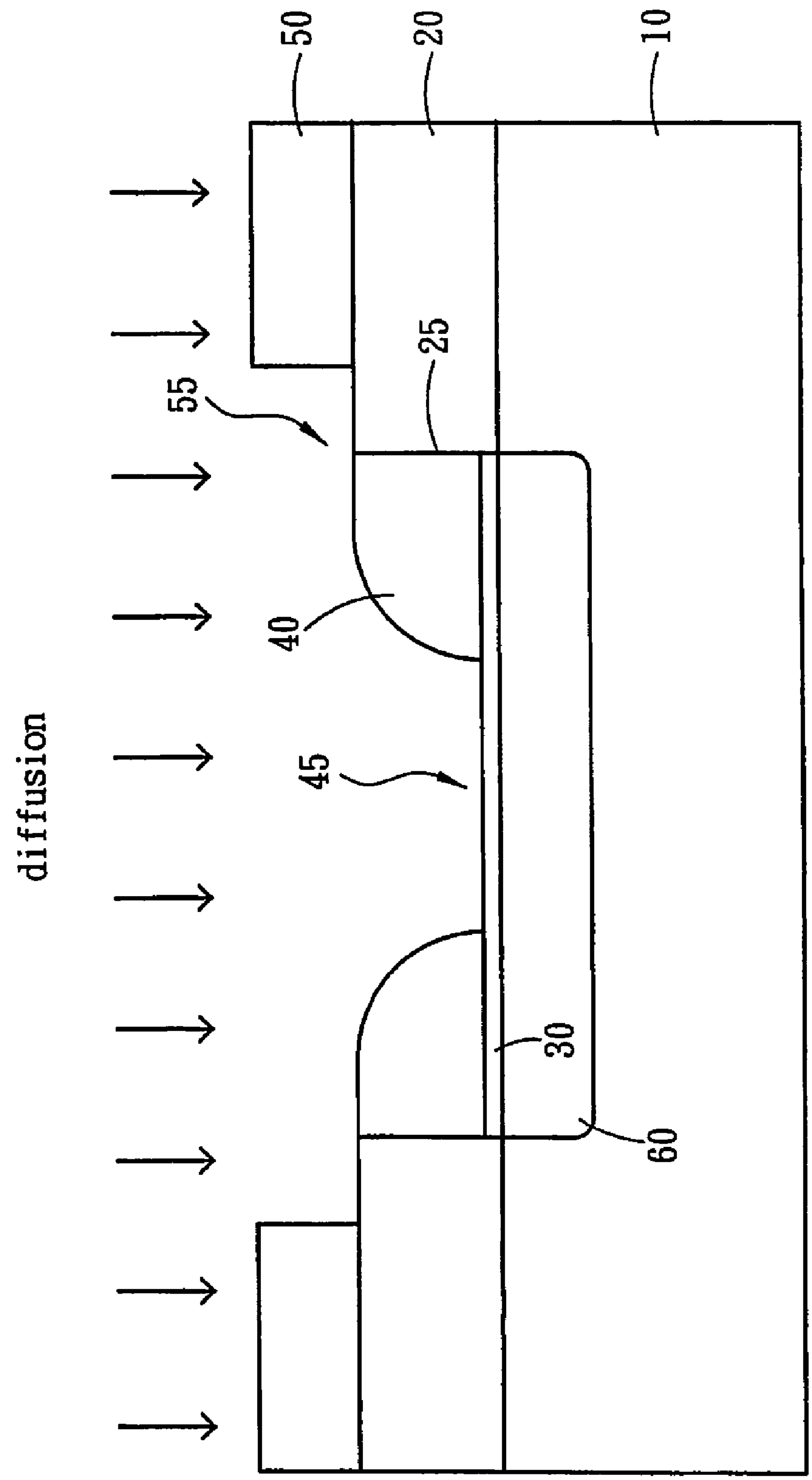
Figure 8:
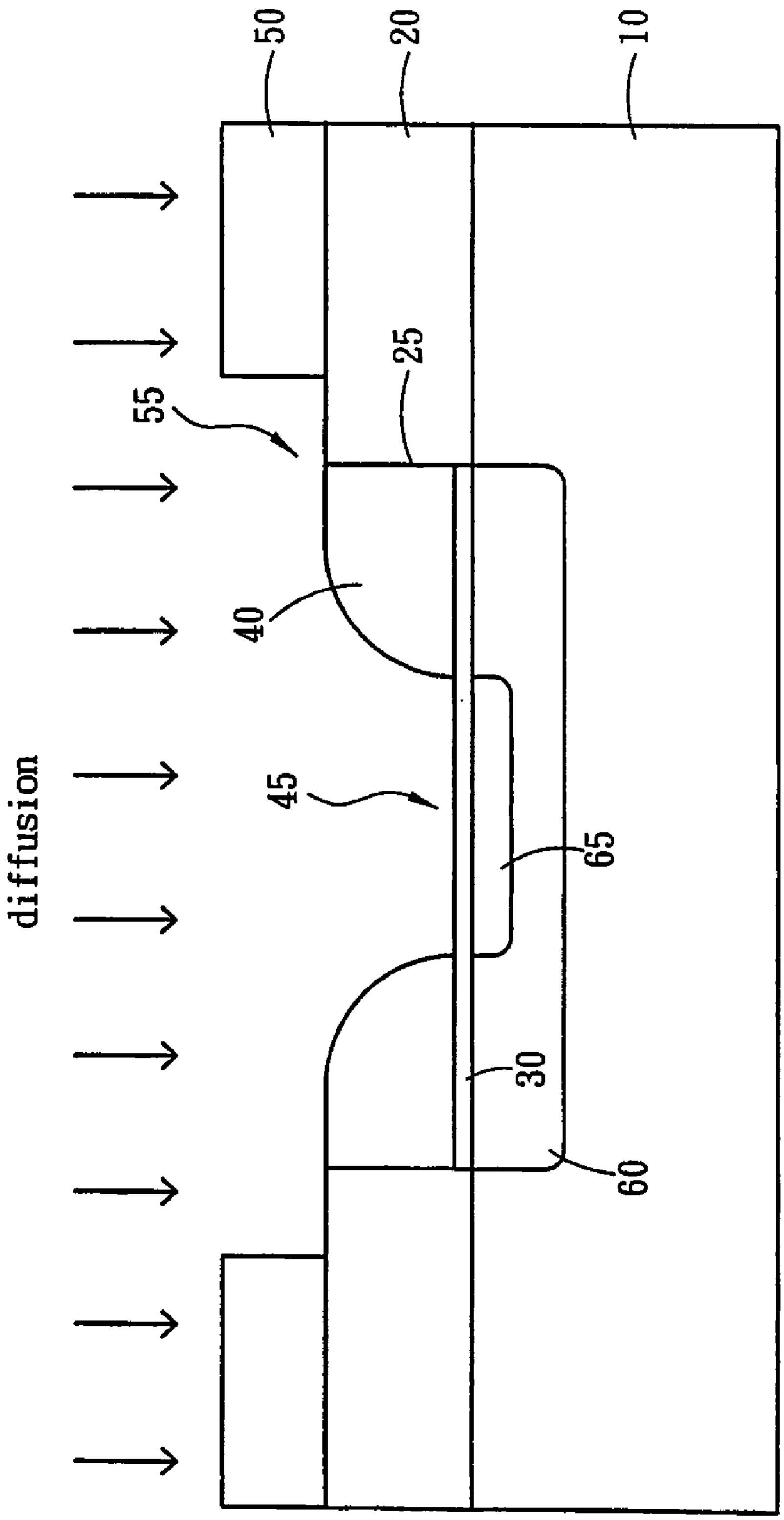
Figure 9:
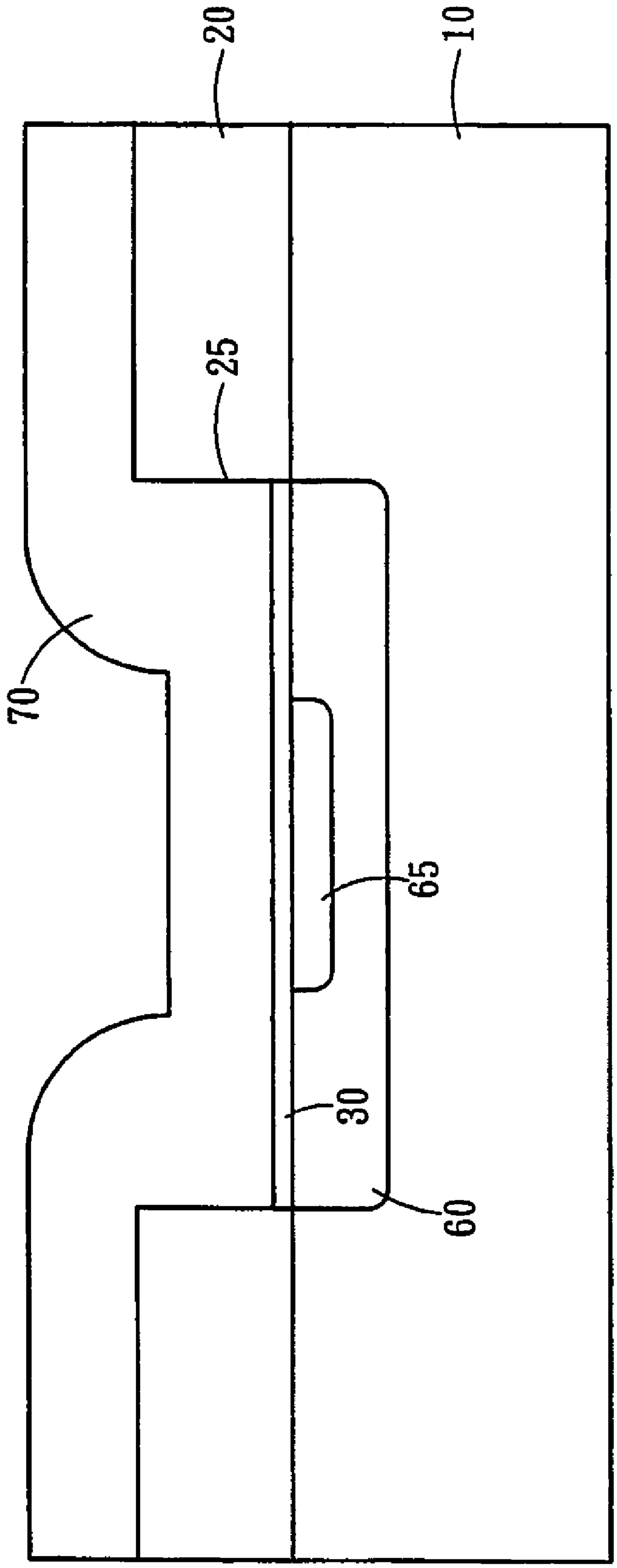
Figure 10:
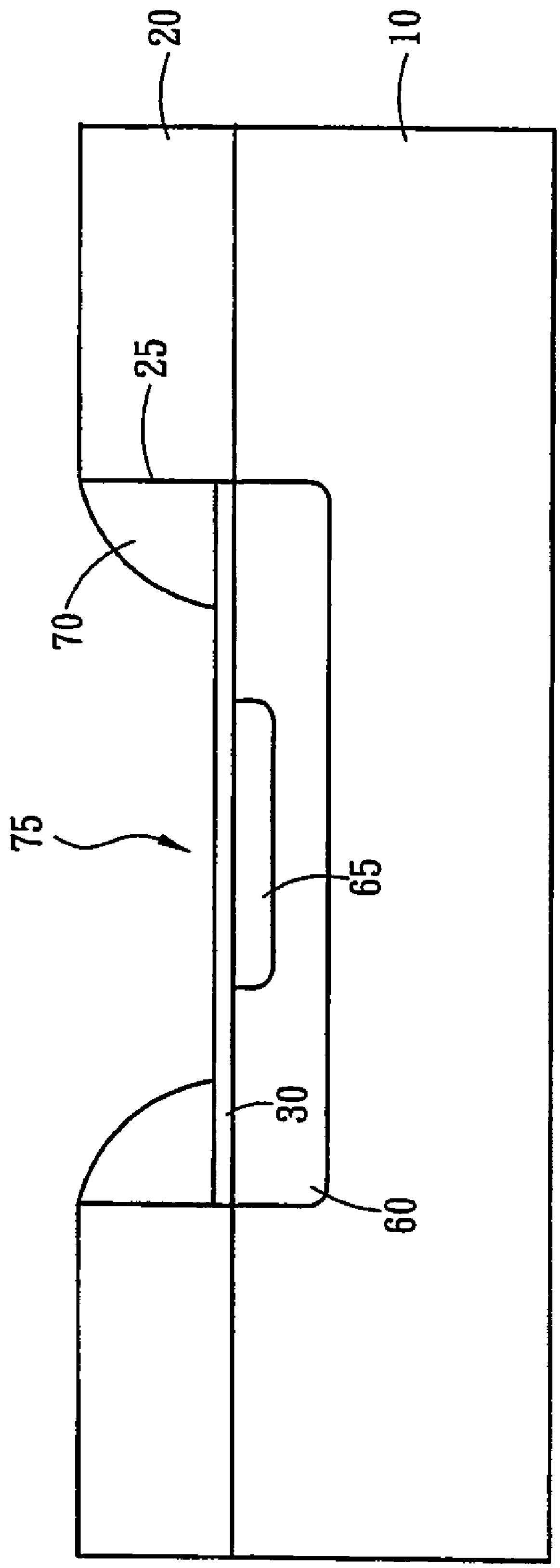
Figure 11:
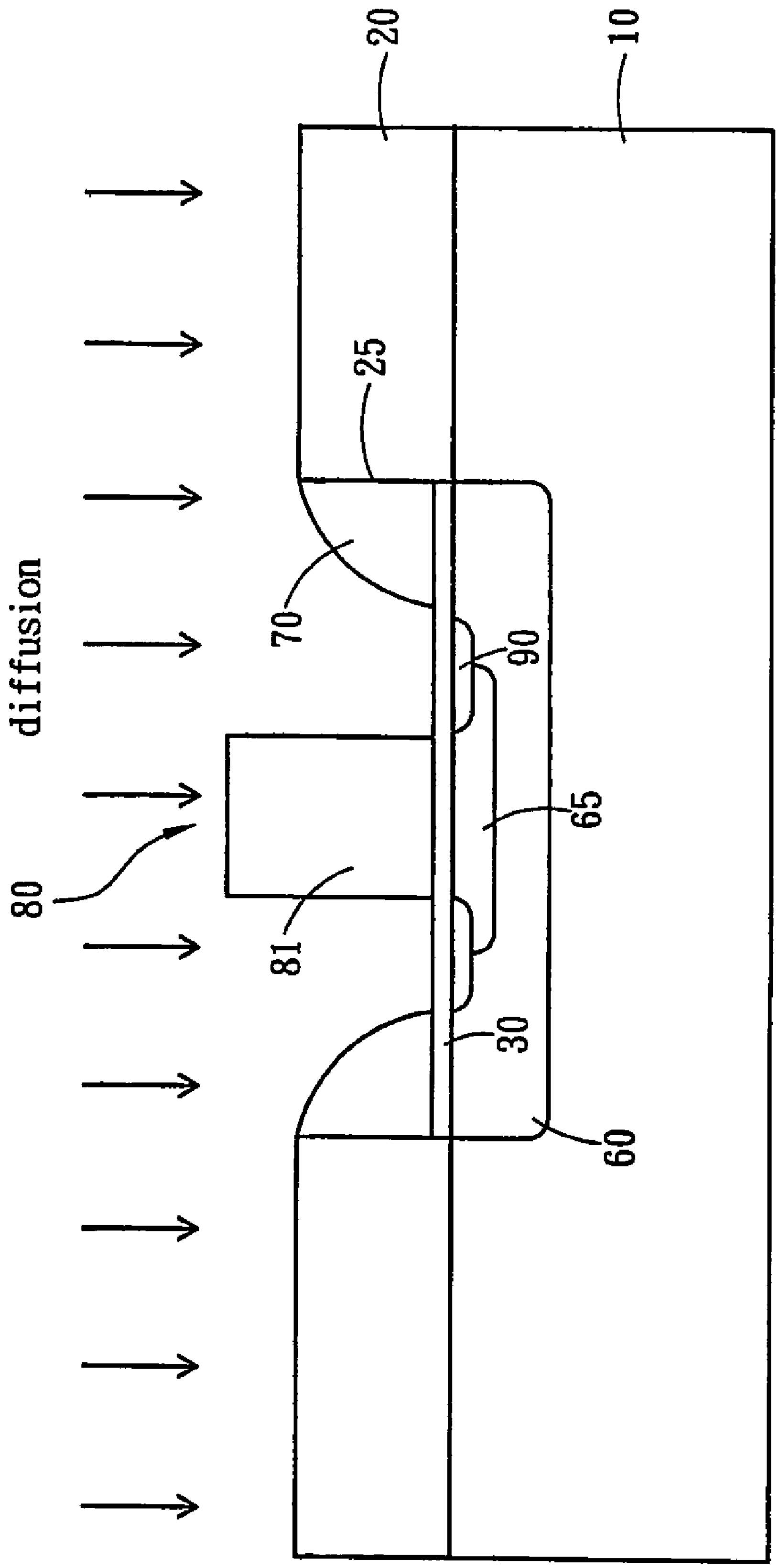
Figure 12:
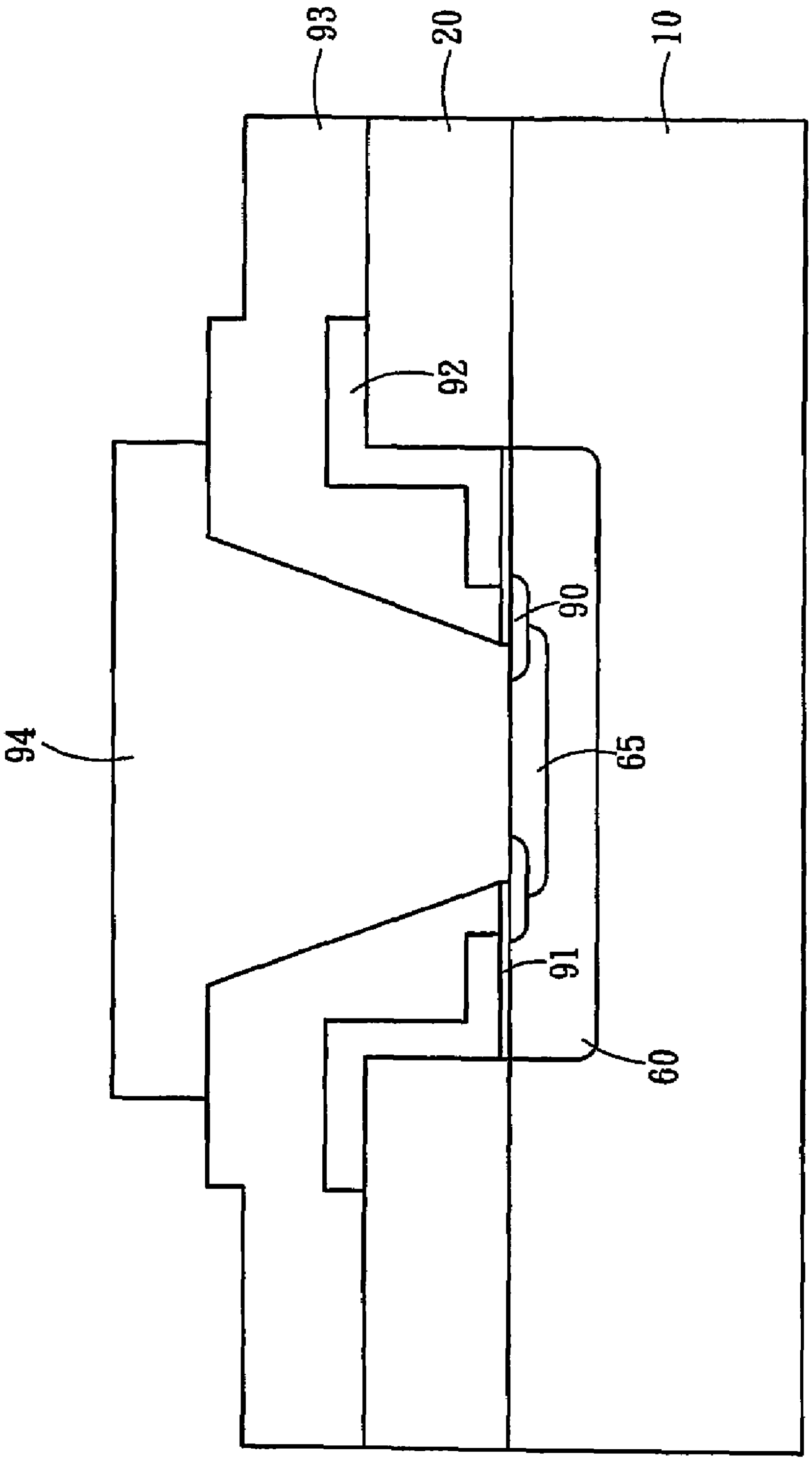

Please sequentially refer to from FIG. 4 to FIG. 12 sectional views separately relating to each step of the manufacturing method of the present invention. The steps of the manufacturing method of the present invention comprises:

- providing a substrate (not shown in the drawing), and forming a silicon layer 10 of a first type doping as a drain;
- oxidizing the surface of the silicon layer 10 to form a field oxide layer 20, and forming a vertical opening 25 on the field oxide layer 20 via the dry etch, and forming a screen oxide layer 30 on the surface where the vertical opening 25 contacts the silicon layer 10 of the first type doping, as shown in FIG. 4;
- depositing a first spacer 40 on the external surface, as shown in FIG. 5, and removing a portion of the first spacer 40, wherein this portion exists above the field oxide layer 20, via the dry etch, and simultaneously forming a first opening 45 having a specified width on the central portion of the first spacer 40, wherein the central portion exists above the screen oxide layer 30, as shown in FIG. 6;

forming a mask 50 to cover the vertical opening 25, wherein the mask 50 has an opening 55 larger than the vertical opening 25, and forming a body 60 of a second type doping via the mask 50 and a diffusion procedure, wherein the body 60 is positioned below the bottom of the screen oxide layer 30, as shown in FIG. 7, and further forming a second body 65 of the second type doping with further higher concentration via another diffusion procedure, wherein the second body 65 is positioned in the region where the first opening 45 contacts the body 60, as shown in FIG. 8, and then removing the first spacer completely;

depositing a second spacer 70 on the external surface, as shown in FIG. 9, and removing a portion of the second spacer 70, wherein this portion exists above the field oxide layer 20, via the dry etch, and simultaneously forming a second opening 75 having a width larger than that of the first opening 45 (referring to FIG. 6), on the central portion of the second spacer 70, wherein the central portion exists above the screen oxide layer 30, as shown in FIG. 10;

forming a mask 80 with a stopper 81 to cover the second body 65, wherein the stopper 81 is smaller than the second body 65, and forming a source 90 of the first type doping via the mask 80 and a diffusion procedure, wherein the source 90 is positioned in a region occupying a portion of the body 60 and a portion of the second body 65 separately, wherein the region ranges from the point stopper 81 to the second spacer 70, as shown in FIG. 11, and then removing the second spacer 70 and screen oxide layer 30 completely, and forming a gate oxide 91 contacting the source 90 in both lateral sides of the vertical opening 25's bottom; and lastly forming a step-like gate conductive layer 92 over the gate oxide 91 and the field oxide layer 20, and then forming an insulating layer 93 to shield the gate conductive layer 92 and the gate oxide 91, and finally depositing a source conductive layer 94, as shown in FIG. 12; thus, the DMOS manufacture of the present invention is completed; wherein the first type doping can be a n-type or p-type doping, and relatively the second type doping will be the p-type or n-type doping, and the material of the first and second spacer can be a polysilicon or a silicon nitride.

Via the aid of the removable spacer method with a self-aligned channel, the present invention can be utilized to manufacture an improved double-diffused metal-oxide-semiconductor, and the method disclosed in the present invention can reduce the parasitic capacitance of the DMOS manufactured thereby, and thus the range of the operating frequency thereof can be expanded.

What is claimed is:

1. A method of manufacturing an improved double-diffused metal-oxide-semiconductor with a self-aligned channel, comprising the following sequential steps:

providing a substrate, and forming a silicon layer of a first type doping as a drain;

oxidizing the surface of said silicon layer to form a field oxide layer; forming a vertical opening on said field oxide layer; then forming a screen oxide layer on the bottom of said vertical opening;

forming a first spacer, which has a first opening with a specified width, over said vertical opening;

forming a body of a second type doping and a second body of the second type doping with further higher concentration, below the bottom of said screen oxide layer; then removing said first spacer;

forming a second spacer, which has a second opening with a width larger than that of said first opening, over said screen oxide layer;

forming a source of the first type doping in the region neighboring said body, said second body and said second opening; then completely removing said second spacer and said screen oxide layer; then forming a gate oxide contacting said source, wherein said gate oxide is positioned in both lateral sides of said vertical opening's bottom; and lastly forming a step-like gate conductive layer over said gate oxide and said field oxide layer; then forming an insulating layer to shield said gate conductive layer and said gate oxide; finally depositing a source conductive layer.

2. The method of manufacturing an improved double-diffused metal-oxide-semiconductor with a self-aligned channel according to claim 1, wherein said first type doping is a n-type doping, and said second type doping is a p-type doping.

3. The method of manufacturing an improved double-diffused metal-oxide-semiconductor with a self-aligned channel according to claim 1, wherein said first type doping is a p-type doping, and said second type doping is a n-type doping.

4. The method of manufacturing an improved double-diffused metal-oxide-semiconductor with a self-aligned channel according to claim 1, wherein the material of said first spacer and said second spacer is a polysilicon.

5. The method of manufacturing an improved double-diffused metal-oxide-semiconductor with a self-aligned channel according to claim 1, wherein the material of said first spacer and said second spacer is a silicon nitride.

* * * * *